United States Patent
Lee (10) Patent No.: US 8,081,531 B2
(45) Date of Patent: Dec. 20, 2011

(54) TEMPERATURE SENSOR CAPABLE OF REDUCING TEST MODE TIME

(75) Inventor: Seong Seop Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 571 days.

(21) Appl. No.: 12/313,308

(22) Filed: Nov. 18, 2008

(65) Prior Publication Data

US 2010/0008160 A1     Jan. 14, 2010

(30) Foreign Application Priority Data

Jul. 9, 2008 (KR) .................. 10-2008-0066608

(51) Int. Cl.
*G11C 7/04* (2006.01)
(52) U.S. Cl. ............. 365/211; 365/225.7; 365/201
(58) Field of Classification Search .............. 365/211, 365/225.7, 201
See application file for complete search history.

(56) References Cited

U.S. PATENT DOCUMENTS

| 6,577,545 B2 * | 6/2003 | Kim et al. ............... 365/201 |
| 7,410,294 B2 | 8/2008 | Shiraki et al. |
| 7,417,448 B2 | 8/2008 | Lim et al. |

FOREIGN PATENT DOCUMENTS

| JP | 54-148580 | 11/1979 |
| JP | 2004-85384 | 3/2004 |
| KR | 10-2008-0005096 | 1/2008 |
| KR | 10-0832029 | 5/2008 |

* cited by examiner

*Primary Examiner* — Jason Lappas
(74) *Attorney, Agent, or Firm* — John P. White; Cooper & Dunham LLP (57) ABSTRACT

A temperature sensor includes a temperature sensing unit for producing a sensing level by sensing an internal temperature in a semiconductor memory device, a reference level generating unit for setting up a reference level by selecting one of a plurality of reference voltages, which are set up according to the internal temperature of the semiconductor memory device, in response to a test mode signal and a temperature detecting signal, wherein the reference level generating unit includes fuse, and a comparison unit for comparing the sensing level to the reference level and producing the temperature detecting signal.

28 Claims, 6 Drawing Sheets

TEMPERATURE SENSOR CAPABLE OF REDUCING TEST MODE TIME

TECHNICAL FIELD

The present disclosure relates to a temperature sensor and, more particularly, to a temperature sensor to provide a test mode which is capable of reducing a test mode time and setting up a reference level without an additional processing.

BACKGROUND

As known widely to those skilled in the art, a semiconductor memory device, such as a DRAM, has a temperature sensor for controlling an operation of internal circuits based on an internal temperature. The temperature information produced by the temperature sensor is used to control the self-refresh period through a detection of the surrounding temperature in order that current consumption is reduced in a self-refresh operation or is used for deciding whether a detected temperature is higher than a predetermined temperature.

Figure 1:
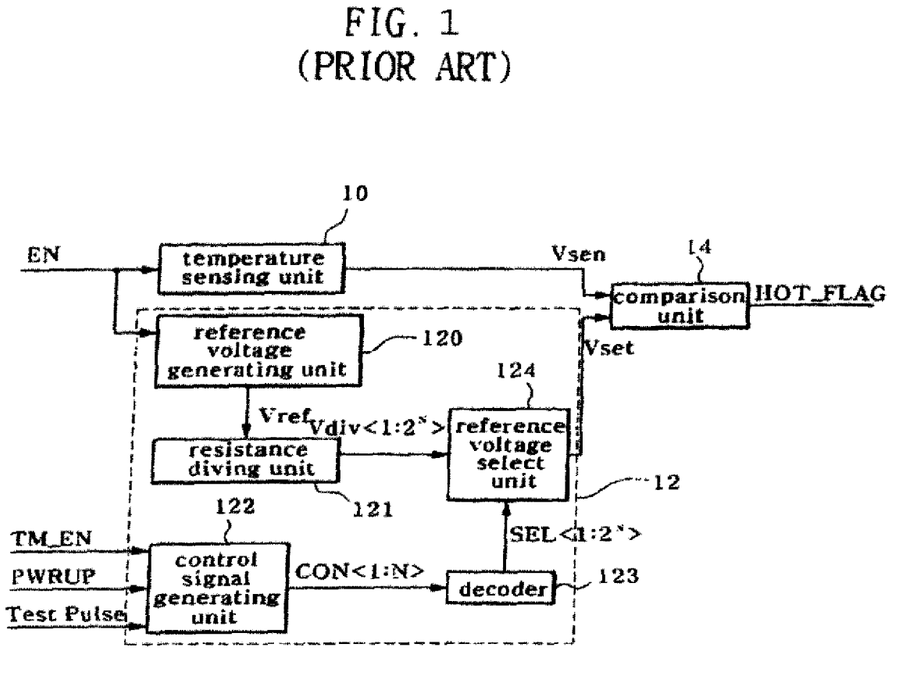
FIG. 1 is a block diagram illustrating a structure of a conventional temperature sensor.

FIG. 1 is a block diagram illustrating a conventional temperature sensor.

Referring to FIG. 1, the conventional temperature sensor includes a temperature sensing unit 10 to produce a sensing level Vsen by sensing an internal temperature in a semiconductor memory device, a reference level generating unit 12 to set up a reference level Vset, and a comparison unit 14 to produce a temperature detecting signal HOT_FLAG by comparing the sensing level Vsen to the reference level Vset.

The operation of the temperature sensor will be described below.

First, the temperature sensing unit 10 senses an internal temperature of the semiconductor memory device and then produces the sensing level Vsen. As the internal temperature becomes higher, the sensing level Vsen is lowered.

Next, the reference level generating unit 12 sets up the reference level Vset which has a predetermined level. At this time, the voltage level of the reference level Vset is determined by fuse cuttings which are made by a plurality of metal fuses (not shown) included in a control signal generating unit 122. The voltage level setup of the reference level Vset will be described in detail below.

A reference voltage Vref generated by a reference voltage generating unit 120 is divided by a resistance dividing unit 121 into a plurality of divided reference voltages Vdiv<$1:2^N$> which have voltage levels corresponding to the internal temperatures of the semiconductor memory device.

Meanwhile, the control signal generating unit 122 includes a plurality of the metal fuses (not shown) and produces a plurality of control signals CON<1:N> which are selectively enabled according to the combination of the fuse cuttings of the metal fuses. A decoder 123 produces a plurality of select signals SEL<$1:2^N$> by decoding the plurality of control signals CON<1:N>.

A reference voltage select unit 124, which receives the divided reference voltages Vdiv<$1:2^N$> and the select signals SEL<$1:2^N$>, selects one out of the divided reference voltages Vdiv<$1:2^N$> in response to the select signals SEL<$1:2^N$>.

As mentioned above, the reference level Vset produced by the reference level generating unit 12 is determined by the combination of the fuse cuttings of the plurality of metal fuses (not shown) in the control signal generating unit 122. Accordingly, the reference level Vset can be set up to a voltage level, which corresponds to a predetermined temperature, for example, 90° C., in the semiconductor memory device, by adjusting the combination of the fuse cuttings of the plurality of metal fuses (not show) included in the control signal generating unit 122.

When the reference level Vset is set up, the temperature sensor compares the sensing level Vsen to the reference level Vset through the comparison unit 14 and then verifies whether the internal temperature of the semiconductor memory device is higher than the predetermined temperature or not. That is, in the case that the sensing level Vsen is lower than the reference level Vset, the temperature sensor outputs a temperature detection signal HOT_FLAG of a low level through the comparison unit 14 because the internal temperature of the semiconductor memory device is higher than the predetermined temperature. Also, in the case that the sensing level Vsen is higher than the reference level Vset, the temperature sensor outputs a temperature detection signal HOT_FLAG of a high level through the comparison unit 14 because the internal temperature of the semiconductor memory device is lower than the predetermined temperature.

On the other hand, the conventional temperature sensor has a test mode to set up the reference level Vset and the test mode is executed by a test pulse Test_Pulse which is inputted into the control signal generating unit 122. This will be illustrated in more detail below.

First, the control signal generating unit 122, which is configured to receive the test pulse signal Test_Pulse, produces the control signals CON<1:N> which are selectively enabled regardless of the combination of the fuse cuttings of the metal fuses (not shown).

Next, the decoder 123 produces the select signals SEL<$1:2^N$> by decoding the control signals CON<1:N> and the reference voltage select unit 124 outputs the reference level Vset by selecting one of the divided reference voltages Vdiv<$1:2^N$> according to the select signals SEL<$1:2^N$>.

The above-mentioned test mode is continuously carried out until the temperature detection signal HOT_FLAG is at a high level, that is, until the sensing level Vsen is higher than the reference level Vset. Namely, if the reference level Vset, which is selected whenever the test pulse Test_Pulse is applied to the control signal generating unit 122, is lower than the sensing level Vsen, the test pulse Test_Pulse is continuously applied to the control signal generating unit 122 until the temperature detection signal HOT_FLAG is at a high level (that is, until the sensing level Vsen is higher than the reference level Vset).

When the temperature detection signal HOT_FLAG is at a high level, the combination of the fuse cuttings of the metal fuses included in the control signal generating unit 122 is determined by the number of the test pulses Test_Pulse which are applied to the control signal generating unit 122 in order to set up the reference level Vset. That is, the combination of the fuse cuttings of the metal fuses, which is required to set up the reference level Vset, is found out by the number of the test pulses Test_Pulse.

However, since the above-mentioned test mode continuously applies the test pulse Test_Pulse to the control signal generating unit until the reference level Vest corresponding to a predetermined internal temperature is set up, it takes a lot of time to set up the reference level Vest. Further, an additional laser cutting process is required to apply the combination of the fuse cuttings, which is found out through the test mode, to the temperature sensor.

SUMMARY

In an aspect of the present disclosure, a temperature sensor is provided that is capable of reducing a test mode time by internally producing a test pulse for a test mode.

In another aspect of the present disclosure, a temperature sensor is provided that is capable of setting up a reference level through a test mode without an additional process by providing a plurality of fuses which are cut based on temperature information.

In an embodiment, a temperature sensor includes a temperature sensing unit for producing a sensing level by sensing an internal temperature in a semiconductor memory device, a reference level generating unit for setting up a reference level by selecting one of a plurality of reference voltages, which are set up according to the internal temperature of the semiconductor memory device, in response to a test mode signal and a temperature detecting signal, wherein the reference level generating unit includes fuse, and a comparison unit for comparing the sensing level to the reference level and producing the temperature detecting signal.

The fuse is cut in response to the temperature detecting signal.

The temperature detecting signal is enabled at a high level when the reference level is lower than the sensing level.

The reference level generating unit includes a reference voltage generating unit for generating a reference voltage in response to an enable signal, a resistance dividing unit comprising receive the reference voltage and generate divided reference voltages by dividing the reference voltage, an enable signal generating unit comprising receive the test mode signal and generate a test mode enable signal in response to the temperature detecting signal, a pulse signal generating unit for generating a counter pulse, which has a period of time, in response to the test mode enable signal, a control signal generating unit for generating a count signal using the counter pulse and for generating control signals in response to the test mode enable signal, a cutting signal generating unit for generating a cutting signal in response to the control signals and the temperature detecting signal, a decoder for decoding the control signals and outputting a select signal, and a reference voltage select unit for selecting one of the divided reference voltages in response to the select signal and outputting the selected divided reference voltage as the reference level.

The enable signal generating unit receives the test mode signal of a high level, in a state where the temperature detecting signal is disabled, and transfers the test mode signal as the test mode enable signal.

The period of the counter pulse is the section or greater in which a state of the test mode enable signal is determined according to the counter pulse.

The control signal generating unit transfers the count signal as the control signal when the test mode enable signal is enabled and produces the control signal based on cutting of the fuse when the test mode enable signal is disabled.

The control signal generating unit includes a count signal generating unit for performing count operations and generating the count signal whenever the counter pulse is input, and a control signal output unit comprising receive the count signal and the cutting signal and generate the control signal in response to the test mode enable signal The count signal generating unit sequentially up-counts the count signal according to number of the counter pulses.

The control signal output unit includes a fuse coupled between an external power supply voltage and a first node, a switch coupled in series to the fuse, wherein the switch cuts the fuse in response to the cutting signal, a latch unit for latching an output signal of the first node, a transfer unit for transferring an output signal of the latch unit in response to the test mode enable signal, a pull-up element for performing a pull-up operation on a second node in response to the test mode enable signal, and a first logic gate for performing a logic operation of the count signal and an output signal of the transfer unit.

The control signal output unit further includes an initialization unit for performing a pull-down operation on the first node in response to a power-up signal.

The cutting signal generating unit includes a transfer unit to transfer the control signal as the cutting signal when the temperature detecting signal is enabled.

The transfer unit includes a second logic gate for performing a logic operation of the control signal and the temperature detecting signal.

The reference voltage select unit selects a low voltage level as the reference level whenever the pulse of the counter pulse is input.

In another embodiment, a temperature sensor includes a divided reference voltage generating unit comprising receive a reference voltage and generate divided reference voltages in response to an enable signal, an enable signal generating unit comprising receive a test mode signal and generate a test mode enable signal in response to a temperature detecting signal, a pulse signal generating unit for generating a counter pulse, which has a period of time, in response to the test mode enable signal, a control signal generating unit for generating a count signal using the counter pulse and for generating control signals in response to the test mode enable signal, wherein the control signal generating unit includes fuse, a cutting signal generating unit for generating a cutting signal in response to the control signals and the temperature detecting signal, a decoder for producing a select signal by decoding the control signals, and a reference voltage select unit for selecting one of the divided reference voltages in response to the select signal and outputting the selected divided reference voltage as the reference level.

The fuse is cut in response to the temperature detecting signal.

The temperature sensor comprises a temperature sensing unit for producing a sensing level by sensing an internal temperature in a semiconductor memory device; and a comparison unit for comparing the sensing level to the reference level and producing the temperature detecting signal.

The temperature detecting signal is enabled at a high level when the reference level is lower than the sensing level.

The enable signal generating unit receives the test mode signal of a high level, in a state where the temperature detecting signal is disabled, and transfers the test mode signal as the test mode enable signal.

The period of the counter pulse is the section or greater in which a state of the test mode enable signal is determined according to the counter pulse.

The control signal generating unit transfers the count signal as the control signal when the test mode enable signal is enabled and produces the control signal based on cutting of the fuse when the test mode enable signal is disabled.

The control signal generating unit includes a count signal generating unit for generating the count signal by performing count operations whenever the counter pulse is input, and a control signal output unit for comprising receive the count signal and the cutting signal and generate the control signal in response to the test mode enable signal.

The count signal generating unit sequentially up-counts the count signal according to number of the counter pulses.

The control signal output unit includes a fuse coupled between an external power supply voltage and a first node, a switch coupled in series to the fuse, wherein the switch cuts the fuse in response to the cutting signal, a latch unit for latching an output signal of the first node, a transfer unit for transferring an output signal of the latch unit in response to the test mode enable signal, a pull-up element for performing a pull-up operation on a second node in response to the test mode enable signal, and a first logic gate for performing a logic operation of the count signal and an output signal of the transfer unit.

The control signal output unit further includes an initialization unit for performing a pull-down operation on the first node in response to a power-up signal.

The cutting signal generating unit includes a transfer unit to transfer the control signal as the cutting signal when the temperature detecting signal is enabled.

The transfer unit includes a second logic gate for performing a logic operation of the control signal and the temperature detecting signal.

The reference voltage select unit selects a low voltage level as the reference level whenever the pulse of the counter pulse is input.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, embodiment of the present disclosure will be described with reference to accompanying drawings. However, the embodiment are for illustrative purposes only and are not intended to limit the scope of the invention.

Figure 2:
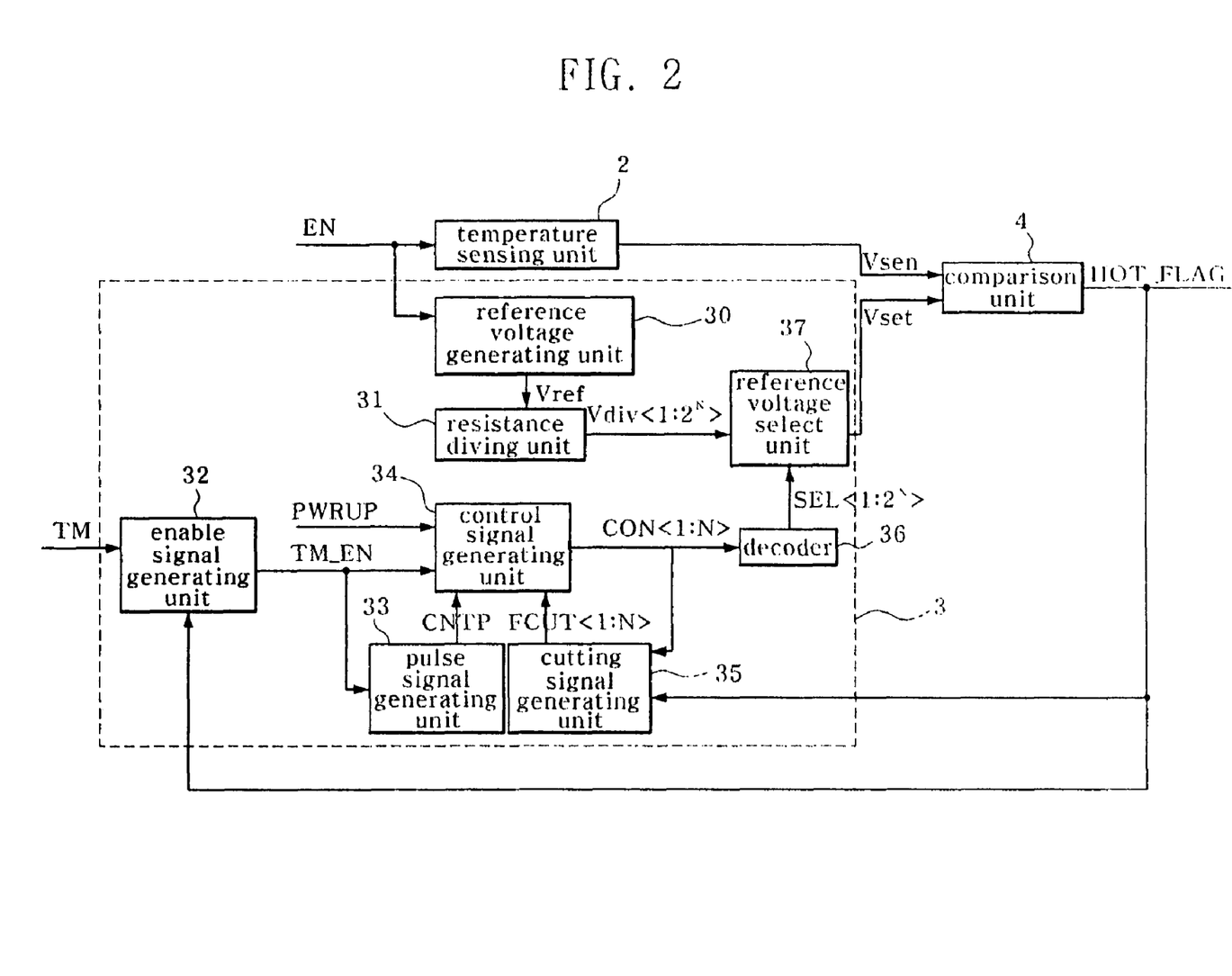
FIG. 2 is a block diagram illustrating an example of a structure of a temperature sensor according to an embodiment of the present disclosure.

As shown in FIG. 2, a temperature sensor according an embodiment of the present disclosure includes a temperature sensing unit 2, a reference level generating unit 3, and a comparison unit 4.

The temperature sensing unit 2, which is driven by an enable signal EN, senses an internal temperature of a semiconductor memory device and produces a sensing level Vsen. The higher the internal temperature of the semiconductor memory device is, the less the voltage level of the sensing level Vsen is reduced.

The reference level generating unit 3 includes a reference voltage generating unit 30, a resistance dividing unit 31, an enable signal generating unit 32, a pulse signal generating unit 33, a control signal generating unit 34, a cutting signal generating unit 35, a decoder 36, and a reference voltage select unit 37.

The reference voltage generating unit 30 is driven in response to the enable signal EN and then produces a reference voltage Vref of a preset level. The reference voltage generating unit 30 is a typical reference voltage generator which is widely used in semiconductor integrated circuits.

The resistance dividing unit 31 receives the reference voltage Vref and then divides it into first to $(2^N)^{th}$ divided reference voltages Vdiv<1:$2^N$>. The first to $(2^N)^{th}$ divided reference voltages Vdiv<1:$2^N$> have voltage levels which correspond to internal temperatures of a semiconductor memory device. At this time, in the preferred embodiment of the present disclosure, the first to $(2^N)^{th}$ divided reference voltages Vdiv<1:$2^N$> can be sequentially set up to lower levels.

The enable signal generating unit 32 receives a test mode signal TM, sets up the reference level Vset and then produces a test mode enable signal TM_EN in response to a temperature detection signal HOT_FLAG. That is, in the case that the temperature detection signal HOT_FLAG is at a low level and the test mode signal TM of a high level is inputted, the enable signal generating unit 32 produces the test mode enable signal TM_EN at a high level and, in the case that the temperature detection signal HOT_FLAG is at a high level, the enable signal generating unit 32 disables the test mode enable signal TM_EN at a low level, regardless of the test mode signal TM.

The pulse signal generating unit 33 produces a periodical signal, a counter pulse CNTP, when the test mode enable signal TM_EN is at a high level. Here, the counter pulse CNTP is inputted and the temperature detection signal HOT_FLAG is produced, wherein the counter pulse CNTP can be set up to a period longer than a section in which the test mode enable signal TM_EN is produced according to a state of the produced temperature detection signal HOT_FLAG. That is, the period of the counter pulse CNTP has to be set up in order that, after a first pulse signal of the counter pulse CNTP is input and the state of the test mode enable signal TM_EN is determined by the first pulse signal, a second pulse signal of the counter pulse CNTP is input. Meanwhile, the pulse signal generating unit 33 is not driven when the test mode enable signal TM_EN is input at a low level.

Figure 3:
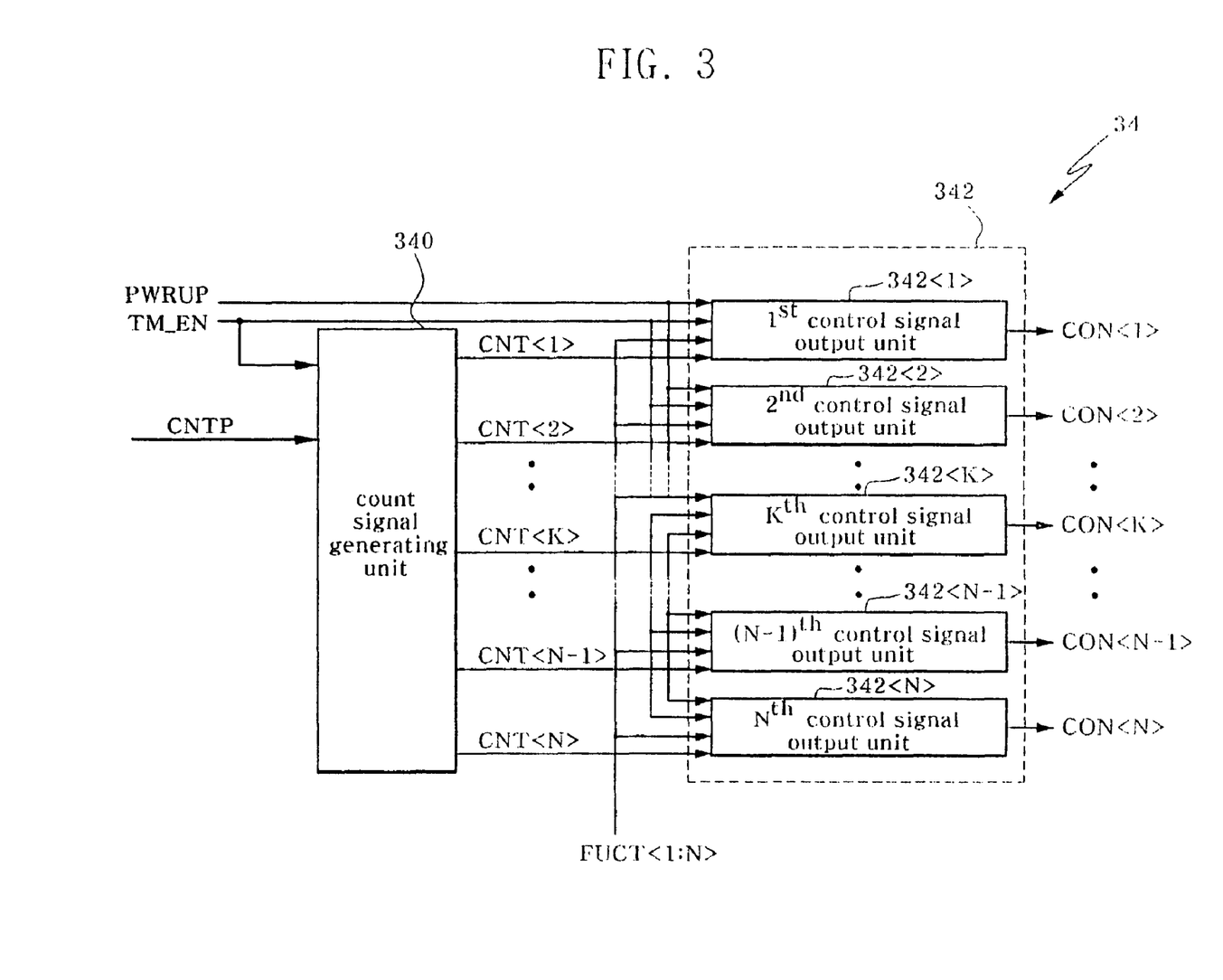
FIG. 3 is a block diagram illustrating an example of a structure of a control signal generating unit in the temperature sensor shown in FIG. 2.

As shown in FIG. 3, the control signal generating unit 34 includes a count signal generating unit 340 and a control signal output unit 342.

The count signal generating unit 340 includes a plurality of counters and produces first to $N^{th}$ count signals CNT<1:N>, by performing a count operation, in a state where the test mode enable signal TM_EN is at a high level, whenever the pulse signals of the counter pulse CNTP are input. Here, the first to $N^{th}$ count signals CNT<1:N> have logic low levels of '0', '0', ..., '0' and '0', respectively, before the counter pulse CNTP is input. That is, each of the first to $N^{th}$ count signals CNT<1:N> has a default value at a low level. Thereafter, the first to $N^{th}$ count signals CNT<1:N> are sequentially up-counted on a bit-by-bit basis whenever the pulse signals of the counter pulse CNTP are input.

On the other hand, the count signal generating unit 340 receives the test mode enable signal TM_EN of a low level and then initializes the first to $N^{th}$ count signals CNT<1:N> to a low level.

The control signal output unit 342 includes first to $N^{th}$ control signal output units 342<1:N>. In the preferred embodiment of the present disclosure, the first to $N^{th}$ control signal output units 342<1:N> are provided for outputting first to $N^{th}$ control signals CON<1:N>. For convenience in illustration, since the first to $N^{th}$ control signal output units 342<1:N> have the same configuration, only the $K^{th}$ control signal output unit 342<K> is illustrated in the present disclosure.

Figure 4:
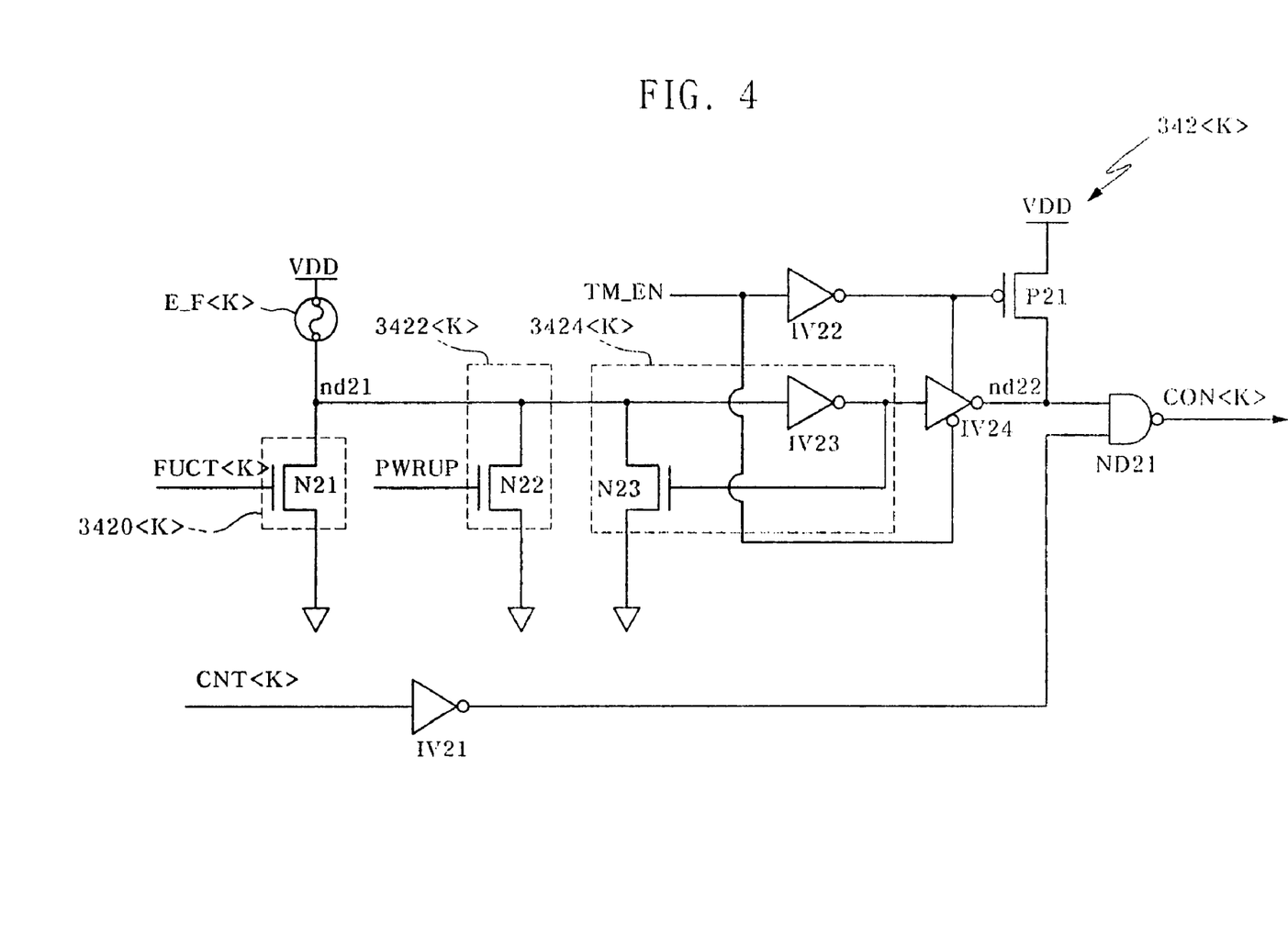
FIG. 4 is a circuit diagram illustrating an example of a structure of a control signal output unit included in the control signal generating unit shown in FIG. 3.

As shown in FIG. 4, the $K^{th}$ control signal output unit 342<K> includes a $K^{th}$ electric fuse E_F<K> which is coupled between an external power supply voltage VDD and a node nd21, a $K^{th}$ switching unit 3420<K> which is coupled in series to the $K^{th}$ electric fuse E_F<K> and turned on in response to a $K^{th}$ cutting signal FUCT<K> to cut the $K^{th}$ electric fuse E_F<K>, a $K^{th}$ initialization unit 3422<K> which includes a NMOS transistor N22 to perform a pull-down operation on the node nd21 in response to a power-up signal PWRUP, a $K^{th}$ latch unit 3424<K> which performs a latch operation in response to an output signal on the node nd21, an inverter IV24 to transfer an output signal of the $K^{th}$ latch unit 3424<K> to a node nd22 in response to the test mode enable signal TM_EN, a PMOS transistor P21 to perform a pull-up operation on the node nd22 in response to the test mode enable signal TM_EN, and a NAND gate ND21 to output the $K^{th}$ control signal CON<K> by performing a NAND operation of an output signal on the node nd22 and the $K^{th}$ count signal CNT<K>.

The $K^{th}$ switching unit 3420<K> includes a NMOS transistor N21 which is coupled between the node nd21 and the ground voltage VSS and turned on in response to the $K^{th}$ cutting signal FUCT<K>. Here, in the preferred embodiment of the present disclosure, the size of the NMOS transistor N21 is larger than that of the NMOS transistor N22. In this structure, when the NMOS transistor N21 is turned on by the $K^{th}$ cutting signal FUCT<K> of a high level, overcurrent flows into the $K^{th}$ electric fuse E_F<K> and the $K^{th}$ electric fuse E_F<K> is automatically cut.

The $K^{th}$ control signal output unit 342<K> outputs the $K^{th}$ count signal CNT<K> as the $K^{th}$ control signal CON<K>, by performing the pull-up operation on the node nd22 using the PMOS transistor P21 which is turned on when the test mode enable signal TM_EN is input. Meanwhile, when the test mode enable signal TM_EN is input at a low level, the $K^{th}$ control signal output unit 342<K> determines the voltage level of the $K^{th}$ control signal CON<K> based on the fuse cutting of the $K^{th}$ electric fuse E_F<K>. That is, when the $K^{th}$ electric fuse E_F<K> is not cut, the high-level signal on the node nd21 is transferred to the inverter IV24 so that the $K^{th}$ control signal CON<K> is output at a low level through the NAND gate ND21. On the contrary, when the $K^{th}$ electric fuse E_F<K> is cut, the low-level signal on the node nd21 is transferred to the inverter IV24 so that the $K^{th}$ control signal CON<K> is at a high level.

As mentioned above, since the first to $N^{th}$ control signal output units 342<1:N> have the same configuration, the control signal output unit 342 outputs the first to $N^{th}$ count signals CNT<1:N> as the first to $N^{th}$ control signals CON<1:N> when the test mode enable signal TM_EN is input at a high level and produces the first to $N^{th}$ control signals CON<1:N> based on the cuttings of the first to $N^{th}$ electric fuses E_F<1: N> when when the test mode enable signal TM_EN is input at a low level.

Figure 5:
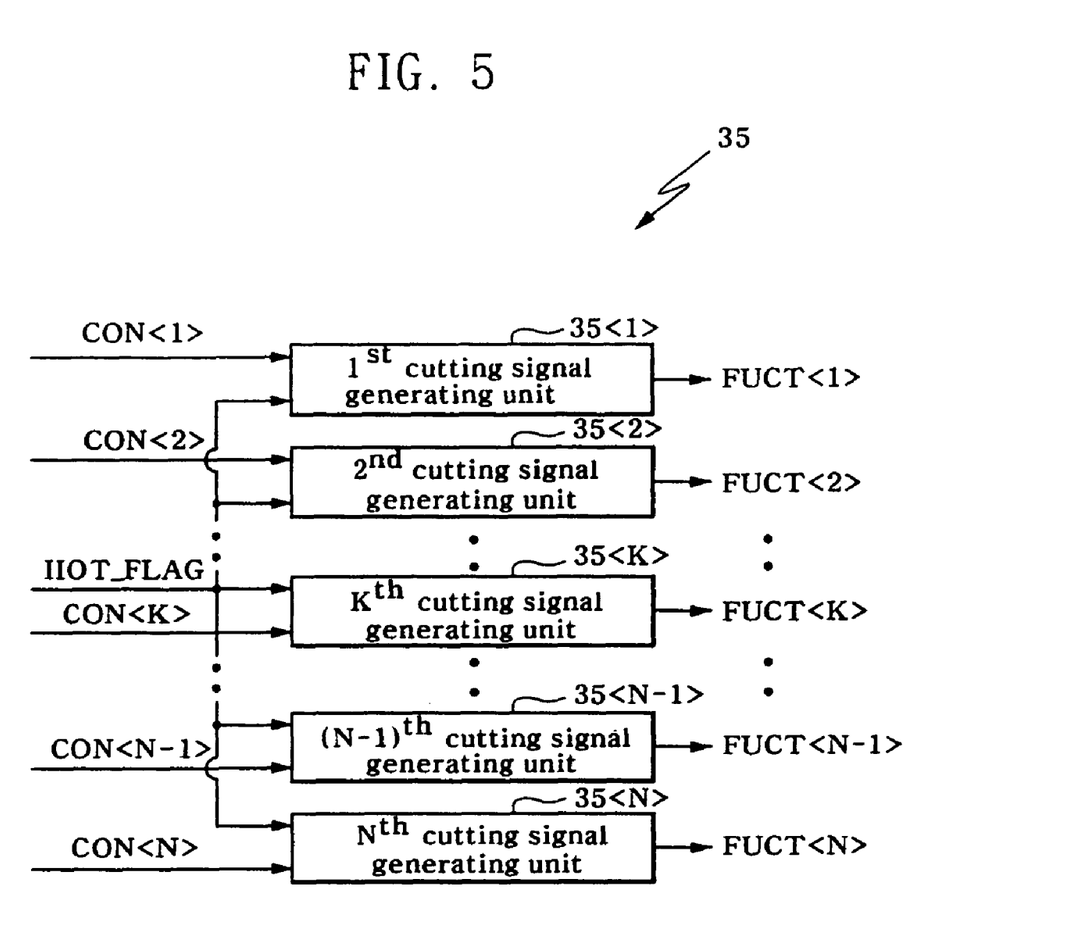
FIG. 5 is a block diagram illustrating an example of a structure of a cutting signal generating unit included in the temperature sensor shown in FIG. 2.

As shown in FIG. 5, the cutting signal generating unit 35 receives the first to $N^{th}$ control signals CON<1:N> and produces the first to $N^{th}$ cutting signals FUCT<1:N> in response to the temperature detection signal HOT_FLAG.

In the preferred embodiment, the cutting signal generating unit 35 can include first to $N^{th}$ cutting signal generating units 35<1:N> to output the first to $N^{th}$ cutting signals FUCT<1: N>. At this time, the first to $N^{th}$ cutting signal generating units 35<1:N> have the same configuration, only the $K^{th}$ cutting signal generating unit 35<K> will be described for convenience in illustration.

Figure 6:
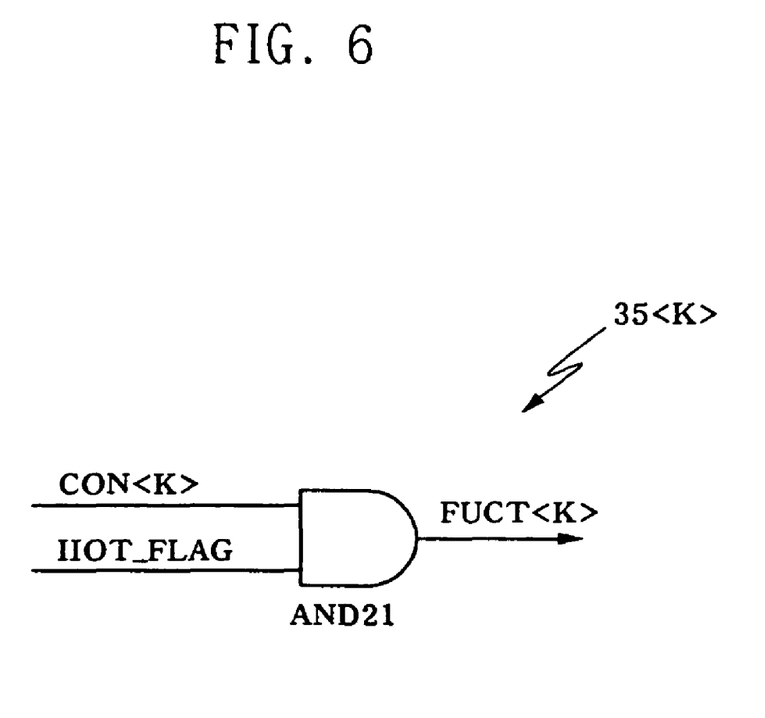
FIG. 6 is a circuit diagram illustrating the cutting signal generating unit shown in FIG. 5.

As shown in FIG. 6, the $K^{th}$ cutting signal generating unit 35<K> includes an AND gate AND21 for performing an AND operation of the $K^{th}$ control signal CON<K> and the temperature detection signal HOT_FLAG and then outputting the $K^{th}$ cutting signal FUCT<K>.

The $K^{th}$ cutting signal generating unit 35<K> produces the $K^{th}$ cutting signal FUCT<K>, which has the same voltage level as the $K^{th}$ control signal CON<K>, in a state where the temperature detection signal HOT_FLAG is at a high level, and disables the $K^{th}$ cutting signal FUCT<K> at a low level, regardless of the $K^{th}$ control signal CON<K>, in a state where the temperature detection signal HOT_FLAG is at a high level.

As mentioned above, since the first to $N^{th}$ cutting signal generating units 35<1:N> have the same configuration, they produce the first to $N^{th}$ cutting signals FUCT<1:N>, which has the same voltage level as the first to $N^{th}$ control signals CON<1:N>, when the temperature detection signal HOT_FLAG is at a high level. For example, in a state where the temperature detection signal HOT_FLAG is at a high level, only the $K^{th}$ cutting signal FUCT<K> of the first to $N^{th}$ cutting o signals FUCT<1:N> is produced at a high level when only the $K^{th}$ control signal CON<K> is input at a high level. The $K^{th}$ cutting signal FUCT<K>, which is produced at a high level, cuts the $K^{th}$ electric fuses E_F<K>.

Meanwhile, in the case where the temperature detection signal HOT_FLAG is input, the first to $N^{th}$ cutting signals FUCT<1:N> are disabled at a low level.

The decoder 36 produces the first to $(2^N)^{th}$ select signals SEL<1:$2^N$> by decoding the first to $N^{th}$ control signals CON<1:N>. At this time, the first to $(2^N)^{th}$ select signals SEL<1:$2^N$> are sequentially enabled. As shown in Table <1>, when the order (N) is 3, that is, when the first to third control signals CON<1:3> of 3 bits are produced by the first to third count signals CNT<1:3> which are counted according to the number of counter pulses, the first to eighth select signals SEL<1:8> are sequentially enabled at a high level.

TABLE 1

| | CON1 | CON2 | CON3 | SEL1 | SEL2 | SEL3 | SEL4 | SEL5 | SEL6 | SEL7 | SEL8 |
|---|---|---|---|---|---|---|---|---|---|---|---|
| 0 | 0 | 0 | 0 | 1 | 0 | 0 | 0 | 0 | 0 | 0 | 0 |
| 1 | 1 | 0 | 0 | 0 | 1 | 0 | 0 | 0 | 0 | 0 | 0 |
| 2 | 0 | 1 | 0 | 0 | 0 | 1 | 0 | 0 | 0 | 0 | 0 |
| 3 | 1 | 1 | 0 | 0 | 0 | 0 | 1 | 0 | 0 | 0 | 0 |
| 4 | 0 | 0 | 1 | 0 | 0 | 0 | 0 | 1 | 0 | 0 | 0 |
| 5 | 1 | 0 | 1 | 0 | 0 | 0 | 0 | 0 | 1 | 0 | 0 |
| 6 | 0 | 1 | 1 | 0 | 0 | 0 | 0 | 0 | 0 | 1 | 0 |
| 7 | 1 | 1 | 1 | 0 | 0 | 0 | 0 | 0 | 0 | 0 | 1 |

The reference voltage select unit 37 receives the first to $(2^N)^{th}$ divided reference voltages Vdiv<1:$2^N$> and outputs the reference voltage Vset by selecting one of the first to $(2^N)^{th}$ divided reference voltages Vdiv<1:$2^N$> in response to the first to $(2^N)^{th}$ select signals SEL<1:$2^N$>. For example, when the third select signal SEL<3> is enabled at a high level, the third divided reference voltage Vdiv<3> is output as the reference voltage Vset.

The comparison unit 4 compares the sensing level Vsen to the reference voltage Vset and then produces the temperature detection signal HOT_FLAG. That is, the comparison unit 4 produces the temperature detection signal HOT_FLAG at a low level when the reference voltage Vset is higher than the sensing level Vsen and produces the temperature detection signal HOT_FLAG at a high level when the reference voltage Vset is lower than the sensing level Vsen.

The operation of the test mode to set up the reference voltage Vset in the above-mentioned temperature sensor will be described in detail. For convenience in illustration, assuming that the temperature detection signal HOT_FLAG is produced at a low level because the sensing level Vsen is lower than the reference voltage Vset and the value of N is 3 in the temperature sensor shown in FIG. 2.

First, when the enables signal EN is input at a high level, a temperature sensing unit 2 produces the sensing level Vsen by detecting the internal temperature of the semiconductor memory device and the reference voltage generating unit 30 produces the reference voltage Vref which is preset in the device. The resistance dividing unit 31 produces the first to eighth divided reference voltages Vdiv<1:8> by dividing the reference voltage Vref. At this time, in the preferred embodiment, the voltage level of the first divided reference voltage Vdiv<1> is highest and the eighth divided reference voltages Vdiv<8> is lowest.

In a state where the temperature detection signal HOT_FLAG is at a low level, the enable signal generating unit 32 produces the test mode enable signal TM_EN of a high level when the test mode signal TM of a high level is input.

When the test mode enable signal TM_EN is at a high level, the pulse signal generating unit 33 produces the counter pulse CNTP as a periodical signal and the control signal generating unit 34, which receives a pulse signal of the counter pulse CNTP, produces the first to third control signals CON<1:3>.

In more detail, in the case where the first pulse of the counter pulse CNTP is input, the count signal generating unit 340 of the control signal generating unit 34 produces the first to third count signals CNT<1:3> which are in logic states of '1', '0' and '0', respectively, and the control signal output unit 342 transfers the first to third count signals CNT<1:3> as the first to third control signals CON<1:3> according to the test mode enable signal TM_EN of a high level. Therefore, the first to third control signals CON<1:3> are in logic states of '1', '0' and '0', respectively, Here, the logic states of '1', '0' and '0' in the first to third control signals CON<1:3> means that the first control signal CON<1> is at a high level, the second control signal CON<2> is at a low level, and the third control signals CON<1:3> is at a low level.

Next, the decoder 36 produces the first to eighth select signals SEL<1:8> by decoding the first to third control signals CON<1:3> and the reference voltage select unit 37 selects one of the first to eighth divided reference voltages Vdiv<1:8> according to the first to eighth select signals SEL<1:8> to output the reference level Vset.

Referring to the Table <1>, the decoder 36 outputs the first to eighth divided reference voltages Vdiv<1:8> which are in logic states of '0', '1', '0', '0', '0', '0', '0' and '0', respectively, by decoding the first to third control signals CON<1:3> which are in logic states of '1', '0' and '0', respectively. Here, the logic states of '0', '1', '0', '0', '0', '0', '0' and '0' in the first to eighth select signals SEL<1:8> means that the first select signal SEL<1> is at a low level, the second select signal SEL<2> is at a high level, the third select signal SEL<3> is at a low level, the fourth select signal SEL<4> is at a low level, the fifth select signal SEL<5> is at a low level, the sixth select signal SEL<6> is at a low level, the seventh select signal SEL<7> is at a low level, and the eighth select signal SEL<8> is at a low level. Therefore, the reference voltage select unit 37 selects the second divided reference voltage Vdiv<2>, which corresponds to the second select signal SEL<2>, and then outputs the selected signal as the reference level Vset.

If the reference level Vset is created as the voltage level of the second divided reference voltage Vdiv<2>, the comparison unit 4 produces the temperature detection signal HOT_FLAG by comparing the reference level Vset to the sensing level Vsen. At this time, assuming that the reference level Vset is higher than the sensing level Vsen, the temperature detection signal HOT_FLAG, which is output by the comparison unit 4, is maintained at a low level.

Accordingly, the test mode enable signal TM_EN produced by the enable signal generating unit 32 is maintained at a high level so that the driving of the pulse signal generating unit 32 is maintained. Further, a second pulse of the counter pulse CNTP, which is produced by the pulse signal generating unit 332, is applied to the control signal generating unit 34.

When the second pulse of the counter pulse CNTP is input, the count signal generating unit 340 of the control signal generating unit 34 produces the first to third count signals CNT<1:3> in logic states of '0', '1' and '0' through a count operation and the control signal output unit 342 transfers the first to third count signals CNT<1:3> as the first to third control signals CON<1:3> according to the test mode enable signal TM_EN of a high level. Accordingly, the logic states of the first to third control signals CON<1:3> are '0', '1' and '0'.

Next, the decoder 36 produces the first to eighth select signals SEL<1:8> by decoding first to third control signals CON<1:3> and the reference voltage select unit 37 outputs the reference level Vset by selecting one of the first to eighth divided reference voltages Vdiv<1:8> according to the first to eighth select signals SEL<1:8>.

In more detail, the decoder 36 decodes the first to third control signals CON<1:3> having the logic states of '0', '1' and '0' and then outputs the first to eighth select signals SEL<1:8> having the logic states of '0', '0', '1', '0', '0', '0', '0' and '0'. At this time, the third select signal SEL<3> of the first to eighth select signals SEL<1:8> is enabled at a high level. Accordingly, the reference voltage select unit 37 selects the third divided reference voltage Vdid<3>, which corresponds to the third select signal SEL<3> of a high level, and outputs it as the reference level Vset.

If the reference level Vset is produced through the third divided reference voltage Vdid<3>, the comparison unit 4 compares the reference level Vset to the sensing level Vsen and outputs the temperature detection signal HOT_FLAG. At this time, if the reference level Vset is lower than the sensing level Vsen, the temperature detection signal HOT_FLAG is transited from a low level to a high level.

When the temperature detection signal HOT_FLAG is transited from a low level to a high level, the reference level Vset is set up to the voltage level of the third divided reference voltage Vdid<3> in the test mode.

In more detail, when the temperature detection signal HOT_FLAG is at a high level, the cutting signal generating unit 35 receives the first to third control signals CON<1:3> and then produces the first to third cutting signals FUCT<1:3>. The cutting signal generating unit 35 receives the first to third control signals CON<1:3> having the logic states of '0', '1' and '0' and produces only the second cutting signal FUCT<2> of the first to third cutting signals FUCT<1:3> at a high level in response to the second control signal CON<2>.

When the temperature detection signal HOT_FLAG is input, the enable signal generating unit 32 disables the test mode enable signal TM_EN at a low level regardless of the test mode signal TM.

In the case where the test mode enable signal TM_EN is at a low level, the control signal generating unit 34 initializes the first to third count signals CNT<1:3> at a low level and produces the first to third control signals CON<1:3> based on the cuttings of the first to third electric fuses E_F<1:3>.

Since the fuse cuttings of the first to third electric fuses E_F<1:3> are determined by the first to third cutting signals FUCT<1:3> and only the second cutting signal FUCT<2> of the first to third cutting signals FUCT<1:3> is at a high level, only the second electric fuse E_F<2> is cut.

As mentioned above, the first to third control signals CON<1:3>, which are output by the control signal output unit 342 based on the fuse cuttings of the first to third electric fuses E_F<1:3>, have the logic States of of '0', '1' and '0'.

The decoder 36 decodes the first to third control signals CON<1:3> and then outputs the first to eighth select signals SEL<1:8>. The reference voltage select unit 37 outputs the reference level Vset by selecting one of the first to eighth divided reference voltages Vdiv<1:8> according to the first to eighth select signals SEL<1:8>. That is, the reference level Vset is set up to the third divided reference voltage Vdiv<3>.

The third divided reference voltage Vdiv<3> is transferred as the reference level Vset and, therefore, the test mode for setting up the reference voltage is terminated.

As apparent from the above, it is not necessary to apply the test pulses Test_Pulse continuously for executing the test mode using the temperature sensor. That is, the test mode time can be reduced by the counter pulse CNTP which is automatically produced when the test mode enable signal TM_EN is applied. Further, the test mode time for setting up the reference level can be reduced without an additional processing, by providing the electric fuse E_F of which the cutting is automatically determined based on the temperature detection signal HOT_FLAG. That is, when the sensing level Vsen is higher than the reference level Vset, the electric fuse E_F is automatically cut if the temperature detection signal HOT_FLAG is produced at a high level.

Although embodiment of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application 10-2008-0066608, filed on Jul. 9, 2008, the entire contents of which are incorporated herein by reference.

What is claimed is:

1. A temperature sensor comprising:
   a temperature sensing unit for producing a sensing level by sensing an internal temperature in a semiconductor memory device;
   a reference level generating unit for setting up a reference level by selecting one of a plurality of reference voltages, which are set up according to the internal temperature of the semiconductor memory device, in response to a test mode signal and a temperature detecting signal, wherein the reference level generating unit includes fuse; and
   a comparison unit for comprising the sensing level to the reference level and producing the temperature detecting signal.

2. The temperature sensor of claim 1, wherein the fuse is cut in response to the temperature detecting signal.

3. The temperature sensor of claim 1, wherein the temperature detecting signal is enabled at a high level when the reference level is lower than the sensing level.

4. The temperature sensor of claim 1, wherein the reference level generating unit includes:
   a reference voltage generating unit for generating a reference voltage in response to an enable signal;
   a resistance dividing unit comprising receive the reference voltage and generate divided reference voltages by dividing the reference voltage;
   an enable signal generating unit comprising receive the test mode signal and generate a test mode enable signal in response to the temperature detecting signal;
   a pulse signal generating unit for generating a counter pulse, which has a period of time, in response to the test mode enable signal;
   a control signal generating unit for generating a count signal using the counter pulse and for generating control signals in response to the test mode enable signal;
   a cutting signal generating unit for generating a cutting signal in response to the control signals and the temperature detecting signal;
   a decoder for decoding the control signals and outputting a select signal; and
   a reference voltage select unit for selecting one of the divided reference voltages in response to the select signal and outputting the selected divided reference voltage as the reference level.

5. The temperature sensor of claim 4, wherein the enable signal generating unit receives the test mode signal of a high level, in a state where the temperature detecting signal is disabled, and transfers the test mode signal as the test mode enable signal.

6. The temperature sensor of claim 4, wherein the period of the counter pulse is the section or greater in which a state of the test mode enable signal is determined according to the counter pulse.

7. The temperature sensor of claim 4, wherein the control signal generating unit transfers the count signal as the control signal when the test mode enable signal is enabled and produces the control signal based on cutting of the fuse when the test mode enable signal is disabled.

8. The temperature sensor of claim 7, wherein the control signal generating unit includes:
   a count signal generating unit for performing count operations whenever the counter pulses are input and generating the count signal; and
   a control signal output unit comprising receive the count signal and the cutting signal and generate the control signal in response to a the test mode enable signal.

9. The temperature sensor of claim 8, wherein the count signal generating unit sequentially up-counts the count signal according to number of the counter pulses.

10. The temperature sensor of claim 8, wherein the control signal output unit includes:
    a fuse coupled between an external power supply voltage and a first node;
    a switch coupled in series to the fuse, wherein the switch cuts the fuse in response to the cutting signal;
    a latch unit for latching an output signal of the first node;
    a transfer unit for transferring an output signal of the latch unit in response to the test mode enable signal;
    a pull-up element for performing a pull-up operation on a second node in response to the test mode enable signal; and
    a first logic gate for performing a logic operation of the count signal and an output signal of the transfer unit.

11. The temperature sensor of claim 10, wherein the control signal output unit further includes an initialization unit for performing a pull-down operation on the first node in response to a power-up signal.

12. The temperature sensor of claim 4, wherein the cutting signal generating unit includes a transfer unit to transfer the control signal as the cutting signal when the temperature detecting signal is enabled.

13. The temperature sensor of claim 12, wherein the transfer unit includes a second logic gate for performing a logic operation of the control signal and the temperature detecting signal.

14. The temperature sensor of claim 4, wherein the reference voltage select unit selects a low voltage level as the reference level whenever the pulse of the counter pulse is input.

15. A temperature sensor comprising:
a divided reference voltage generating unit comprising receive a reference voltage and generate divided reference voltages in response to an enable signal;
an enable signal generating unit comprising receive a test mode signal and generate a test mode enable signal in response to a temperature detecting signal;
a pulse signal generating unit for generating a counter pulse, which has a period of time, in response to the test mode enable signal;
a control signal generating unit for generating a count signal using the counter pulse and for generating control signals in response to the test mode enable signal, wherein the control signal generating unit includes fuse;
a cutting signal generating unit for generating a cutting signal in response to the control signals and the temperature detecting signal;
a decoder for producing a select signal by decoding the control signals; and
a reference voltage select unit for selecting one of the divided reference voltages in response to the select signal and outputting the selected divided reference voltage as the reference level.

16. The temperature sensor of claim 15, wherein the fuse is cut in response to the temperature detecting signal.

17. The temperature sensor of claim 15, further comprising:
a temperature sensing unit for producing a sensing level by sensing an internal temperature in a semiconductor memory device; and
a comparison unit for comparing the sensing level to the reference level and producing the temperature detecting signal.

18. The temperature sensor of claim 17, wherein the temperature detecting signal is enabled at a high level when the reference level is lower than the sensing level.

19. The temperature sensor of claim 18, wherein the enable signal generating unit receives the test mode signal of a high level, in a state where the temperature detecting signal is disabled, and transfers the test mode signal as the test mode enable signal.

20. The temperature sensor of claim 15, wherein the period of the counter pulse is the section or greater in which a state of the test mode enable signal is determined according to the counter pulse.

21. The temperature sensor of claim 15, wherein the control signal generating unit transfers the count signal as the control signal when the test mode enable signal is enabled and produces the control signal based on cutting of the fuse when the test mode enable signal is disabled.

22. The temperature sensor of claim 21, wherein the control signal generating unit includes:
a count signal generating unit for generating the count signal by performing count operations whenever the counter pulses are input; and
a control signal output unit for comprising receive the count signal and the cutting signal and generate the control signal in response to the test mode enable signal.

23. The temperature sensor of claim 22, wherein the count signal generating unit sequentially up-counts the count signal according to number of the counter pulses.

24. The temperature sensor of claim 22, wherein the control signal output unit includes:
a fuse coupled between an external power supply voltage and a first node;
a switch coupled in series to the fuse, wherein the switch cuts the fuse in response to the cutting signal;
a latch unit for latching an output signal of the first node;
a transfer unit for transferring an output signal of the latch unit in response to the test mode enable signal;
a pull-up element for performing a pull-up operation on a second node in response to the test mode enable signal; and
a first logic gate for performing a logic operation of the count signal and an output signal of the transfer unit.

25. The temperature sensor of claim 24, wherein the control signal output unit further includes an initialization unit for performing a pull-down operation on the first node in response to a power-up signal.

26. The temperature sensor of claim 15, wherein the cutting signal generating unit includes a transfer unit to transfer the control signal as the cutting signal when the temperature detecting signal is enabled.

27. The temperature sensor of claim 26, wherein the transfer unit includes a second logic gate for performing a logic operation of the control signal and the temperature detecting signal.

28. The temperature sensor of claim 15, wherein the reference voltage select unit selects a low voltage level as the reference level whenever the pulse of the counter pulse is input.

* * * * *